(12) United States Patent
Tzivanopoulos et al.

(10) Patent No.: US 11,422,157 B2
(45) Date of Patent: Aug. 23, 2022

(54) SHUNT RESISTOR FOR DETECTING THE STATUS OF AN ELECTRICAL ENERGY STORAGE UNIT

(71) Applicant: Robert Bosch GmbH, Stuttgart (DE)

(72) Inventors: Chrysanthos Tzivanopoulos, Remseck am Neckar (DE); Sven Bergmann, Brackenheim (DE)

(73) Assignee: Robert Bosch GmbH, Stuttgart (DE)

( * ) Notice: Subject to any disclaimer, the term of this patent is extended or adjusted under 35 U.S.C. 154(b) by 419 days.

(21) Appl. No.: 16/610,721

(22) PCT Filed: May 3, 2018

(86) PCT No.: PCT/EP2018/061271
§ 371 (c)(1),
(2) Date: Nov. 4, 2019

(87) PCT Pub. No.: WO2018/206377
PCT Pub. Date: Nov. 15, 2018

(65) Prior Publication Data
US 2021/0156888 A1 May 27, 2021

(30) Foreign Application Priority Data

May 8, 2017 (DE) .................... 10 2017 207 713.1

(51) Int. Cl.
*G01R 1/20* (2006.01)
*G01R 31/364* (2019.01)
(Continued)

(52) U.S. Cl.
CPC ........... *G01R 1/203* (2013.01); *G01R 31/364* (2019.01); *H01C 1/012* (2013.01); *H01C 1/144* (2013.01)

(58) Field of Classification Search
CPC .......... H01C 1/012; H01C 1/44; G01R 1/203; G01R 31/364
See application file for complete search history.

(56) References Cited

U.S. PATENT DOCUMENTS 3,245,021 A * 4/1966 Warrenn ................. G01R 1/203
338/49
5,644,283 A * 7/1997 Grosse-Wilde ........ H02H 9/026
338/21

(Continued)

FOREIGN PATENT DOCUMENTS

CN 103338592 A 10/2013
CN 103545285 A 1/2014
(Continued)

OTHER PUBLICATIONS

International Search Report for Application No. PCT/EP2018/061271 dated Sep. 12, 2018 (English Translation, 3 pages).

*Primary Examiner* — Kyung S Lee
(74) *Attorney, Agent, or Firm* — Michael Best & Friedrich LLP

(57) ABSTRACT

The invention relates to a shunt resistor (2) for detecting the status of an electrical energy storage unit (1), wherein the shunt resistor (2) comprises a first layer (4), a second layer (6) and a third layer (8). According to the invention, the layers (4, 6, 8) are arranged in a layered manner in a stacking direction (V), wherein the second layer (6) is arranged between the first layer (4) and the third layer (8), and wherein the layers (4, 6, 8) are in physical contact with one another at one of the sides having the greatest respective surface area, and wherein the layers (4, 6, 8) are arranged at least partially overlapping.

11 Claims, 4 Drawing Sheets

(51) Int. Cl.
*H01C 1/012* (2006.01)
*H01C 1/144* (2006.01)

(56) References Cited

U.S. PATENT DOCUMENTS

| | | | | |
|---|---|---|---|---|
| 9,625,494 | B2* | 4/2017 | Nakamura | G01R 15/14 |
| 10,614,933 | B2* | 4/2020 | Endo | H01C 13/00 |
| 11,187,725 | B2* | 11/2021 | Endo | H01C 1/01 |
| 2003/0146077 | A1* | 8/2003 | Enomoto | H01C 3/00 |
| | | | | 200/61.53 |
| 2015/0212115 | A1* | 7/2015 | Nakamura | G01R 1/203 |
| | | | | 338/332 |
| 2017/0212148 | A1* | 7/2017 | Hetzler | H02G 5/02 |
| 2020/0051717 | A1* | 2/2020 | Nakamura | H01L 23/647 |

FOREIGN PATENT DOCUMENTS

| | | |
|---|---|---|
| CN | 105518960 | 4/2016 |
| DE | 10226393 | 1/2004 |
| DE | 102010035485 | 3/2012 |
| DE | 102012204844 | 10/2013 |
| DE | 102013219571 | 4/2015 |
| EP | 1191550 | 3/2002 |
| EP | 1435524 | 7/2004 |
| EP | 2279539 | 2/2011 |
| EP | 2485299 | 8/2012 |
| JP | 2004347429 A | 12/2004 |
| KR | 101448936 | 10/2014 |

* cited by examiner

SHUNT RESISTOR FOR DETECTING THE STATUS OF AN ELECTRICAL ENERGY STORAGE UNIT

BACKGROUND OF THE INVENTION

The invention relates to a shunt resistor for detecting the status of an electrical energy storage unit.

In applications in the automotive sector in particular, for example in a motor vehicle, electrical energy storage systems, for example battery systems, consisting of a multiplicity of electrical energy storage units, for example battery cells, are playing an ever increasing role. An electrical energy storage system and, in particular, the individual electrical energy storage units are usually monitored in this case by an electronic management system which is usually a battery management system in the automotive sector. An important part of such a battery management system may be an electronic battery sensor which accurately captures the voltage, current intensity and temperature of a corresponding electrical energy storage unit at regular intervals. In this case, the recorded data can be processed, for example, by a central control unit or by a control unit integrated in the electronic battery sensor. Corresponding evaluations are forwarded, as a signal, to an electrical system of the respective motor vehicle, with the result that further actions can be performed by an electrical system control unit located there.

A shunt resistor is generally used to permanently measure and store currents, that is to say even in quiescent phases of the respective battery. This makes it possible not only to determine a residual charge of a battery, but this also enables a comparison with earlier values, with the result that knowledge of aging and a possible remaining service life of a battery or of a battery cell is possible. The battery system can therefore be monitored in an improved manner by measuring the current of the shunt resistor. A shunt resistor can generally be used wherever a current measurement is required.

The shunt resistor is usually a measuring bridge made of copper/copper-nickel-manganese/copper. Voltage fluctuations which occur in the measuring bridge are evaluated and are forwarded, as a signal, to a respective electrical system or control unit in the motor vehicle.

The document KR 101448936 describes a shunt resistor module which can be connected to the poles of a battery by means of screw connections.

The document EP 2485299 describes a battery status sensor which has a shunt resistor and can be connected to a battery pole.

SUMMARY OF THE INVENTION

The invention provides a shunt resistor having the advantage over the prior art that the shunt resistor has a compact structure and can be fitted to an electrical energy storage unit in the most space-saving manner possible. The invention now provides a shunt resistor, in particular of an electronic battery sensor, having the characterizing features of the independent and/or dependent claims, an electronic energy storage unit and a method for producing the shunt resistor.

The inventive configuration of the shunt resistor has the advantage that the shunt resistor can be arranged on the electrical energy storage unit in the most space-saving manner possible. As a result of a first layer and a second layer and/or a third layer being arranged in a stacking direction in contrast to an arrangement of the layers in the direction of a longitudinal axis and/or a transverse axis, the shunt resistor does not require much installation space in the direction of its longitudinal axis and/or the transverse axis. This avoids the shunt resistor projecting beyond a contour of an anode and/or of a cathode and/or of the electrical storage unit in the direction of the longitudinal axis and/or in the direction of the transverse axis. In this case, the shunt resistor is generally installed on the anode of the electrical storage unit. The compact embodiment of the shunt resistor has the advantage that no additional installation space has to be provided for the shunt resistor in the installation space in which the electrical energy storage unit is intended to be installed, in particular no additional installation space is required in the direction of the longitudinal axis and in the direction of the transverse axis.

Furthermore, the described inventive configuration of the shunt resistor, in which the layers are arranged in a layered manner in the direction of the stacking direction, and wherein a second layer is arranged between a first layer and a third layer, and wherein the layers are each in physical contact with one another by way of a side respectively having the largest surface area, and wherein the layers are arranged in an at least partially overlapping manner, has the advantage that the shunt resistor and the arrangement of the layers are stable and robust with respect to external mechanical loads, in particular compressive forces in the direction of the stacking direction.

The subclaims relate to further advantageous embodiments of the present invention. According to one advantageous embodiment, the shunt resistor has a plurality of advantages. On the one hand, the individual layers of the shunt resistor have a step profile in the direction of the stacking direction. This design has the advantage that, despite the compact and space-saving arrangement of the shunt resistor, contact can be reliably made with the largest surfaces of the individual layers. The practice of making contact with the individual layers, in particular the first layer and/or the third layer, is necessary, in particular, for using the shunt resistor to detect the status of the electrical energy storage unit and can be carried out in a space-saving installation space according to one advantageous embodiment of the inventive configuration of the shunt resistor.

One exemplary embodiment of the practice of making contact with the first layer and/or the second layer and/or the third layer can be effected by means of an attached cable or an attached flexible film, in particular a welded or soldered flexible film. In this case, the flexible film is used to connect the surface of the first layer and/or of the second layer and/or of the third layer of the shunt resistor to the electronic battery sensor, for example, which captures a voltage, a current intensity and a temperature at regular intervals. In addition, as a result of the advantageous arrangement of the layers and, in particular, of the surfaces, it is possible to ensure a space-saving arrangement of at least one contact-making element, in particular the flexible films, in which the flexible films do not project beyond the contour of the anode and/or of the cathode and/or of the electrical energy storage unit in the direction of the longitudinal axis and in the direction of the transverse axis. It is also advantageous that the individual layers of the shunt resistor have different lengths in the direction of the longitudinal axis of the layers and/or in the direction of a transverse axis of the layers.

According to one embodiment, the shunt resistor is in the form of a measuring bridge comprising the first layer, the second layer and the third layer. In this case, the first layer is composed of a copper alloy, the second layer is composed of a resistance material, in particular a copper-nickel-manganese alloy, and the third layer is composed of a copper alloy. Alternatively, an aluminum alloy can also be used instead of the copper alloy in the layers or one layer may be composed of a copper alloy and one layer may be composed of an aluminum alloy. In this case, the shunt resistor has at least two connections in the form of accessible surfaces. A copper-nickel-manganese alloy, in particular Manganin® or Isaohm®, can be selected, for example, as the resistance material.

According to one particularly advantageous embodiment, the design of the shunt resistor has the advantage that the shunt resistor has a recess which runs through the shunt resistor in the direction of the stacking direction, in particular through the first, second and third layers of the shunt resistor. This has the advantage that the largest surface areas of the first, second and third layers are each reduced. Introducing the at least one recess into the shunt resistor makes it possible to increase the resistance value of the shunt resistor by reducing the cross-sectional area of the shunt resistor through which current flows, in particular of the first layer, the second layer and the third layer and, in particular, in the direction of the stacking direction.

Furthermore, varying the size of the at least one recess and the possibility of providing a plurality of recesses in the surface of the shunt resistor make it possible to achieve the advantage that it is possible to bring about a specific target resistance value for the shunt resistor, which value can be optimally adapted for the respective requirement.

An advantage of the design according to another advantageous embodiment is that a high degree of stability of the shunt resistor is achieved by welding the individual layers of the shunt resistor. In addition, the layers are stable in their position with respect to one another and are robust with respect to external mechanical loads as a result of the layers of the shunt resistor being welded. This high degree of stability and robustness of the shunt resistor according to the advantageous embodiment applies, on the one hand, to bending forces in the direction of the stacking direction. On the other hand, however, this also applies to forces which run in the direction of the longitudinal axis or the transverse axis, in particular to shearing forces. The failure probability of the shunt resistor can be reduced and the service life can be increased by this measure. Furthermore, the practice of welding the layers of the shunt resistor before installation has the advantage that the installation of the shunt resistor is simplified since the shunt resistor can be installed as a whole. This makes it possible to reduce a required installation time and consequently installation costs.

It is also advantageous if the shunt resistor is a measuring bridge made of copper/copper-nickel-manganese alloy/copper and also has two connections, wherein the two connections are formed, in particular, as the surface of the first layer and the surface of the third layer, wherein the surfaces of that side of the layers which faces away from the stacking direction are provided for this purpose. As a result of the shunt resistor which is kept simple, it is possible to choose the two connections provided in a relatively free manner and to therefore simplify a contact-making process. Furthermore, combining the materials of copper and aluminum in the structure of the first layer and in the structure of the third layer makes it possible to improve the strength of the respective layer, while retaining optimum current conductivity.

The present invention also relates to a method for producing a shunt resistor for detecting the status of a battery, in which the shunt resistor has a first layer, a second layer and a third layer and the layers are also arranged in a layered manner in the direction of the stacking direction. In this case, the second layer is arranged between the first and third layers, wherein the layers are each in physical contact with one another by way of one of the sides respectively having the largest surface area of a layer in such a manner that the layers are arranged in a partially overlapping manner.

One advantage of the design according to another advantageous embodiment is that the layers form a step profile in the direction of the stacking direction, as a result of which the surfaces of the layers become accessible in the direction of the stacking direction. This inventive configuration of the invention and of the production method has the advantage of ensuring optimum accessibility of the individual surfaces of the shunt resistor, in particular for a flexible film to be attached and/or a cable to be attached and/or a bond connection, with a compact and space-saving structure at the same time.

BRIEF DESCRIPTION OF THE DRAWINGS

Further advantages and configurations of the invention emerge from the description and the accompanying drawings.

It goes without saying that the features mentioned above and the features yet to be explained below can be used not only in the respectively stated combination, but also in other combinations or alone, without departing from the scope of the present invention.

DETAILED DESCRIPTION

Figure 1:
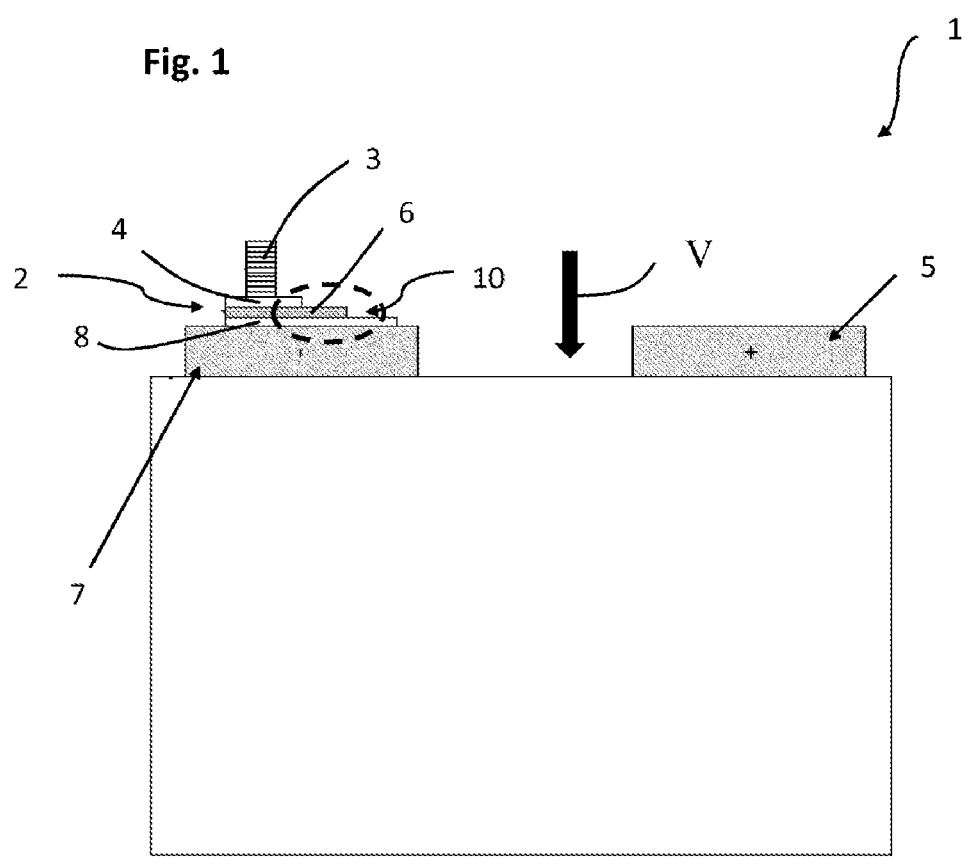
FIG. 1 shows a side view of an embodiment of a shunt resistor according to the invention on an electrical energy storage unit.

The invention is schematically illustrated in the drawings on the basis of embodiments and is described in detail below with reference to the drawings.

FIG. 1 shows an electrical energy storage unit 1 having a shunt resistor 2 for detecting the status of the electrical energy storage unit 1 according to one preferred exemplary embodiment. In this case, the shunt resistor 2 has a first layer 4, a second layer 6 and a third layer 8. FIG. 1 also shows that the electrical energy storage unit 1 has a cathode 5 and an anode 7, wherein the shunt resistor 2 for detecting the status of the electrical energy storage unit 1 is installed on the anode 7, in particular.

The three layers 4, 6, 8 of the shunt resistor 2 are arranged in a layered manner in this case in the direction of a stacking direction V, wherein the second layer 6 is arranged between the first layer 4 and the third layer 8 and the layers 4, 6, 8 are each in physical contact with one another by way of one of the sides respectively having the largest surface area. In this case, the layers 4, 6, 8 can be arranged in an at least partially overlapping manner, with the result that the layers 4, 6, 8 form a step profile 10, for example. This advantageous design of the shunt resistor 2, in which the layers 4, 6, 8 form the step profile 10, has the advantage that the surfaces of the individual layers 4, 6, 8 are at least partially accessible in the direction of the stacking direction V.

In this case, the first layer 4 and the third layer 8 each have the materials of copper and/or aluminum. In one advantageous embodiment, the first layer 4 and the third layer 8 may be configured, in particular, in such a manner that a shaping aluminum plate is provided with a copper sheath, wherein the aluminum provides the respective layer with the stability and strength, whereas good electrical conductivity of the respective layer is produced by sheathing the first layer 4 and/or the third layer 8 with copper. In this case, the second layer 6 may have an alloy of copper, nickel and manganese, in particular Manganin®. With the aid of the shunt resistor 2 according to the invention, it is possible for only one layer made of a resistance material, for example made of a copper-nickel-manganese alloy, to be required, in which case the configuration of the resistance material component is determined by means of a predefined electrical resistance, for example needed to carry out a meaningful measurement. Different connection variants are possible in this case, as explained below.

In addition, a terminal 3 can be arranged on the shunt resistor 2 on that side with the largest surface area which is not in each case in contact with the energy storage unit 1, in particular the anode 7.

Figure 2:
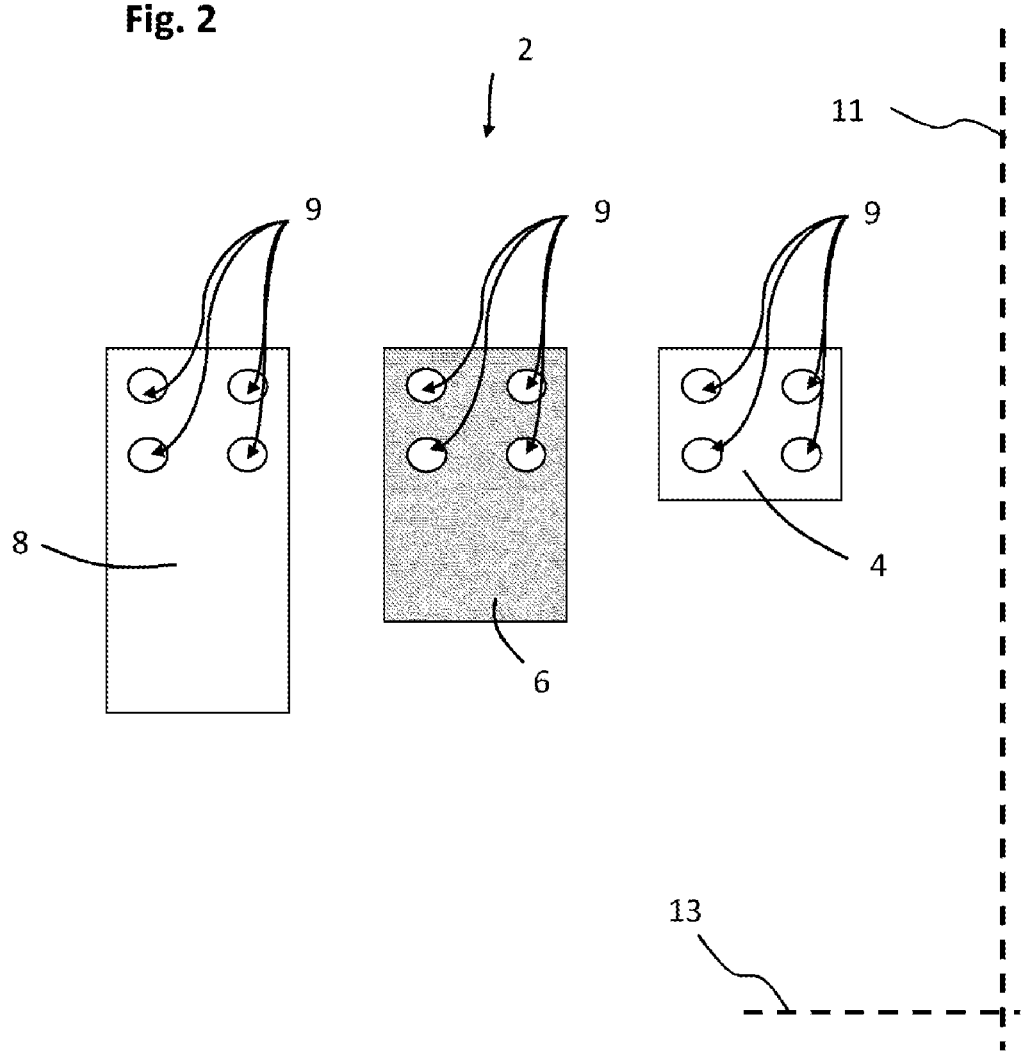
FIG. 2 shows a plan view of individual layers of the shunt resistor according to the invention.

FIG. 2 shows the shunt resistor 2 which is constructed from the first layer 4, the second layer 6 and the third layer 8. In this respect, the second layer 6 is stacked onto the third layer 8 in the direction of the stacking direction V which is not illustrated here (see FIG. 1), with the result that the second layer 6 is in contact with the third layer 8 by way of one of the two sides with the largest surface area. Furthermore, the first layer 4 is stacked onto the second layer 6 in the direction of the stacking direction V, with the result that the shunt resistor 2 forms the step profile 10.

FIG. 2 also shows a longitudinal axis 11 of the shunt resistor 2, wherein the longitudinal axis 11 runs in the direction of the layers 4, 6, 8 and in the direction of the steps of the step profile 10 formed. In this case, the transverse axis 13 runs orthogonal to the longitudinal axis 11 and the stacking direction V, as shown in FIG. 2.

In this case, FIG. 2 illustrates an advantageous form of the shunt resistor 2 and of the layers 4, 6, 8 for forming the step profile 10. The individual layers 4, 6, 8 advantageously form different lengths in the direction of the longitudinal axis 11, with the result that the stacked layers 4, 6, 8, which are stacked in the direction of the stacking direction V in particular, produce the step profile 10. Another embodiment of the step profile 10 of the shunt resistor 2 can be achieved by virtue of the fact that the individual layers 4, 6, 8 have different widths in the direction of the transverse axis 13, with the result that the layers 4, 6, 8 form the step profile 10 in the direction of the transverse axis 13. Another embodiment of the shunt resistor 2 provides for the individual layers 4, 6, 8 to overlap in the direction of the longitudinal axis 11 and/or the transverse axis 13 and to therefore not only form the step profile 10 but rather to protrude at both ends in each case in the direction of the longitudinal axis 11 and/or the transverse axis 13, but the individual layers 4, 6, 8 are always in physical contact with one another by way of at least some of their sides respectively having the largest surface area.

FIG. 2 also shows that the shunt resistor 2 and the individual layers 4, 6, 8 are provided with at least one recess 9, wherein the resulting recess is produced in the shunt resistor 2 by stacking the individual layers 4, 6, 8 with the at least one recess 9 in the direction of the stacking direction V. In this case, a resistance value R of the shunt resistor 2 can be changed by means of the at least one recess 9. Introducing the at least one recess 9 increases, in particular, the resistance value R of the shunt resistor 2. Furthermore, the size of the at least one recess 9 or of the plurality of recesses 9 can be increased. In this case, the area, in particular the cross-sectional area, of the shunt resistor 2 is reduced by increasing the diameter and/or the size of the at least one recess 9, as a result of which the resistance value R of the shunt resistor 2 can be increased. Increasing the number of recesses 9 in the shunt resistor 2 has the same effect in this case since the cross-sectional area of the shunt resistor 2, in particular, can be reduced by increasing the number of recesses 9, with the result that the resistance value R of the shunt resistor 2 can be increased as a result.

Further measures which improve the inventive configuration of the shunt resistor 2 are also welding and/or cohesive connection and/or form-fitting connection and/or force-fitting connection of the individual layers 4, 6, 8. This makes it possible to prevent the individual layers from shifting with respect to one another in the direction of the longitudinal axis 11 and/or the transverse axis 13 and thus the stability of the shunt resistor 2 and a possibly connected flexible film 12 being reduced and therefore the function of the shunt resistor 2 no longer being available.

FIG. 2 shows an exemplary embodiment of the individual layers 4, 6, 8 of the shunt resistor 2, in which the individual layers 4, 6, 8 have four recesses 9.

Figure 3:
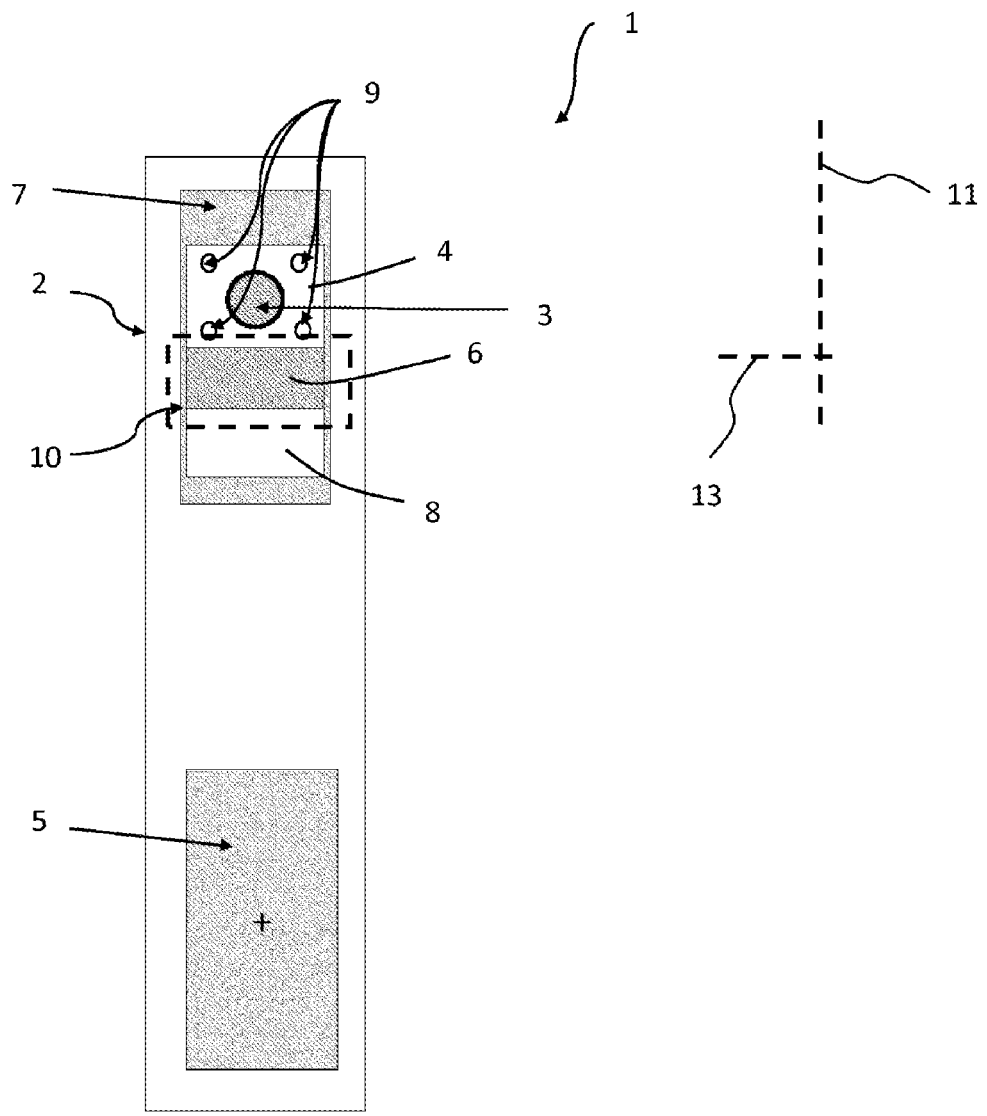
FIG. 3 shows a plan view of the shunt resistor according to the invention and its arrangement on an anode of the electrical energy storage unit.

FIG. 3 shows an embodiment of the shunt resistor 2, in which the shunt resistor 2 is shown on the anode 7 on an electrical energy storage unit 1. It is also shown that the terminal 3 can be situated on the first layer 4 of the shunt resistor 2 and is welded to the shunt resistor 2 or connected to the shunt resistor 2 in another manner.

FIG. 3 shows another particularly advantageous embodiment of the shunt resistor 2, in which a high degree of stability of the shunt resistor 2 can be achieved by welding the individual layers 4, 6, 8 of the shunt resistor 2 or joining the individual layers 4, 6, 8 of the shunt resistor 2 in another manner. The arrangement of the layers 4, 6, 8 is therefore stable and robust with respect to external mechanical loads and, in particular, to shifting of the layers with respect to one another in the direction of the longitudinal axis 11 and/or the transverse axis 13. This high degree of stability and robustness of the shunt resistor 2 also applies to bending forces in the direction of the stacking direction V and, on the other hand, to forces which run in the direction of the longitudinal axis 11 or the transverse axis 13.

Figure 4:
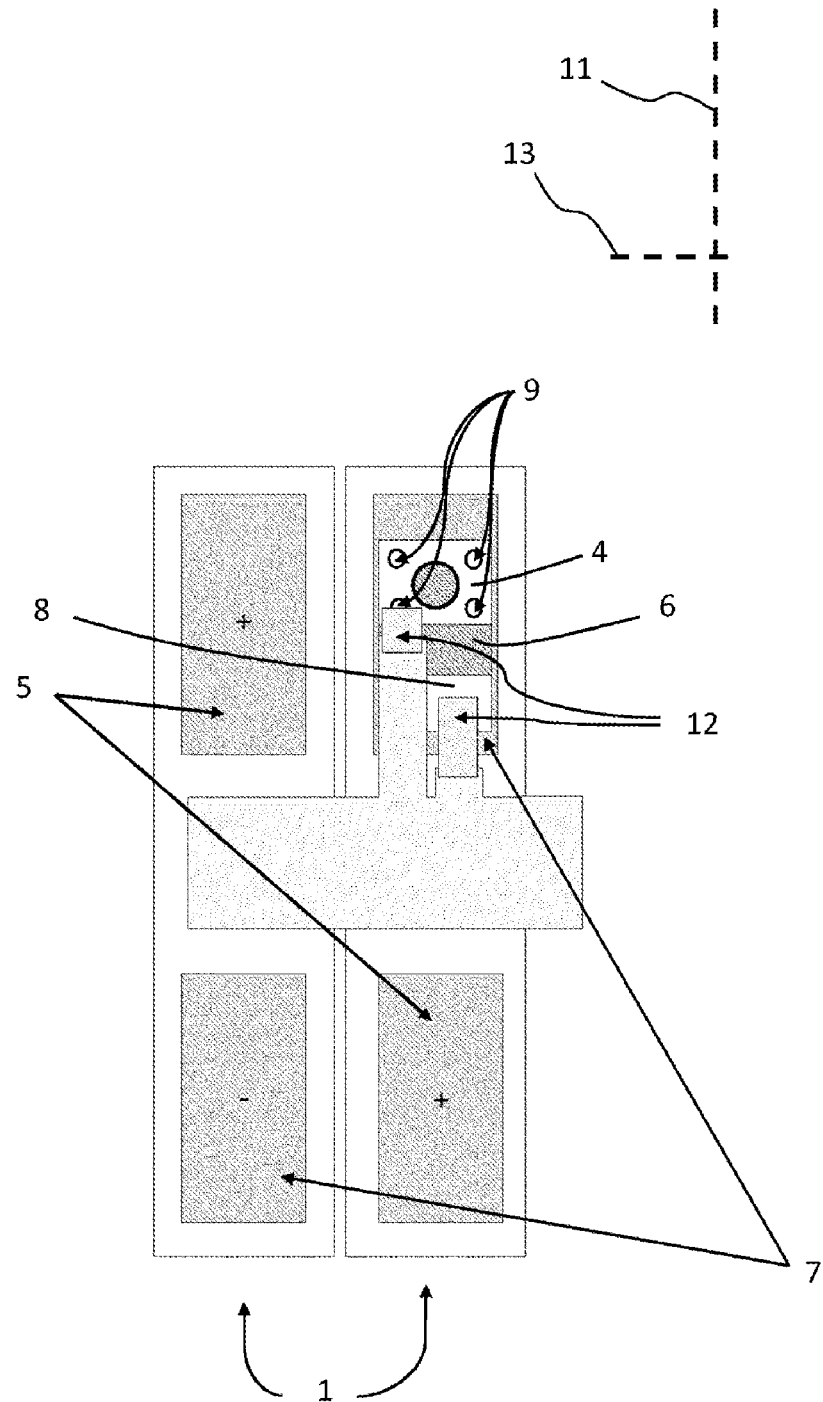
FIG. 4 shows a plan view of the shunt resistor according to the invention and a possible embodiment of a welded flexible film arrangement on a pole connection of the electrical energy storage unit.

FIG. 4 shows two electrical energy storage units 1 which are arranged beside one another in the direction of the transverse axis 13. The cathode 5 and the anode 7 of the respective electrical energy storage unit 1 are respectively arranged in this case on different sides in the direction of the longitudinal axis 11, with the result that the cathode 5 of one electrical energy storage unit 1 is respectively arranged beside the anode 7 of the second electrical energy storage unit 1. This arrangement of the electrical energy storage units 1 can be used to connect them to one another in a series circuit.

FIG. 4 also shows that the shunt resistor 2 has the first layer 4, the second layer 6 and the third layer 8, wherein the shunt resistor 2 and the layers 4, 6, 8 have at least the one recess 9. As already described in the preceding figures, the shunt resistor 2 has the step profile 10, in particular by means of different lengths of the individual layers 4, 6, 8 in the direction of the longitudinal axis 11. As a result of this step profile 10 which is formed, a flexible film 12 can be respectively fitted to the first layer 4 and a further flexible film 12 can be fitted to the third layer 8, in which case this can be carried out in a compact design and no flexible film 12 projects from the installation space of the electrical energy storage unit 1 in the direction of the longitudinal axis 11 or the transverse axis 13. The use of the flexible film 12 has the advantage that contact can be made with the shunt resistor 2, in particular the first layer 4 and/or the third layer 8, even in the case of a small and/or angled installation space of the electrical energy storage unit 1, since the flexible film 12 is flexible. In this case, the flexible film 12 is also connected to an electronic battery sensor and serves the purpose of measuring voltages and/or current and/or temperatures by means of the shunt resistor 2 and/or forwarding it/them to the electronic battery sensor. As a result, the flexible film 12 and the electronic battery sensor can be used to derive the battery status, in particular a residual charge.

The invention claimed is:

1. A shunt resistor (2) for detecting the status of an electrical energy storage unit (1), wherein the shunt resistor (2) has a first layer (4), a second layer (6) and a third layer (8), characterized in that the layers (4, 6, 8) are arranged in a layered manner in a direction of a stacking direction (V), wherein the second layer (6) is arranged between the first layer (4) and the third layer (8), and wherein the layers are each in physical contact with one another by way of sides respectively having a largest surface area, and wherein the layers (4, 6, 8) are arranged in an at least partially overlapping manner, wherein the shunt resistor (2) is provided with at least one recess (9) that extends through each of the first layer (4), second layer (6), and third layer (8) along the stacking direction (V), wherein an area of the shunt resistor (2) is reduced by a size of the at least one recess (9) in such a manner that a predefined resistance value of the shunt resistor (2) is achieved.

2. The shunt resistor (2) as claimed in claim 1, characterized in that the individual layers (4, 6, 8) of the shunt resistor (2) are arranged in a direction of a longitudinal axis (11) of the layers and/or a transverse axis (13) of the layers in such a manner that a step profile (10) is produced when layering the individual layers (4, 6, 8) in the direction of the stacking direction (V).

3. The shunt resistor (2) as claimed in claim 2, characterized in that the individual layers (4, 6, 8) of the shunt resistor (2) have different lengths in the direction of the longitudinal axis (11) of the layers (4, 6, 8) and/or the transverse axis (13) of the layers (4, 6, 8).

4. The shunt resistor (2) as claimed in claim 1, characterized in that the individual layers (4, 6, 8) of the shunt resistor (2) are welded to one another.

5. The shunt resistor (2) as claimed in claim 1, characterized in that the second layer (6) has a copper-nickel-manganese alloy.

6. The shunt resistor (2) as claimed in claim 5, characterized in that the first layer (4) and the third layer (8) each comprise the materials of copper and/or aluminum.

7. The shunt resistor (2) as claimed in claim 1, characterized in that the first layer (4) and the third layer (8) each comprise the materials of copper and/or aluminum.

8. An electronic energy storage unit (1) having the shunt resistor (2) as claimed in claim 1.

9. A method for producing the shunt resistor (2) of claim 1 for detecting the status of the electrical energy storage unit (1), wherein the method comprises arranging the first layer (4), the second layer (6) and the third layer (8) in a layered manner in the direction of the stacking direction (V), wherein arranging the second layer (6) between the first layer (4) and the third layer (8), and arranging the layers (4, 6, 8) such that the layers (4, 6, 8) are each in physical contact with one another by way of one of the sides respectively having the largest surface area of a layer in such a manner that the layers (4, 6, 8) are arranged in an at least partially overlapping manner.

10. The method as claimed in claim 9, further comprising arranging wherein the individual layers (4, 6, 8) of the shunt resistor (2) in the direction of a longitudinal axis (11) of the layers (4, 6, 8) and/or a transverse axis (13) of the layers (4, 6, 8) in such a manner that a step profile (10) is produced when layering the individual layers (4, 6, 8) in the direction of the stacking direction (V), as a result of which surfaces of the individual layers (4, 6, 8), in particular, become at least partially accessible in the direction of the stacking direction (V).

11. The shunt resistor (2) as claimed in claim 1, characterized in that the individual layers (4, 6, 8) of the shunt resistor (2) are arranged in a direction of a longitudinal axis (11) of the layers and/or a transverse axis (13) of the layers in such a manner that a step profile (10) is produced when layering the individual layers (4, 6, 8) in the direction of the stacking direction (V), as a result of which surfaces of the individual layers (4, 6, 8) are at least partially accessible in the direction of the stacking direction.

* * * * *